US011342042B2

(12) United States Patent
Johnson et al.

(10) Patent No.: US 11,342,042 B2
(45) Date of Patent: May 24, 2022

(54) INTERCONNECTED COMMAND/ADDRESS RESOURCES

(71) Applicant: Micron Technology, Inc., Boise, ID (US)

(72) Inventors: Jason M. Johnson, Nampa, ID (US); Yoshinori Fujiwara, Boise, ID (US); Kevin G. Werhane, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 16/836,646

(22) Filed: Mar. 31, 2020

(65) Prior Publication Data

US 2021/0304838 A1 Sep. 30, 2021

(51) Int. Cl.
*G11C 29/30* (2006.01)
*G11C 29/48* (2006.01)
*H01L 25/065* (2006.01)
*G11C 5/06* (2006.01)
*H01L 23/538* (2006.01)
*G11C 8/06* (2006.01)

(52) U.S. Cl.
CPC ............... *G11C 29/48* (2013.01); *G11C 5/06* (2013.01); *G11C 8/06* (2013.01); *H01L 23/5386* (2013.01); *H01L 25/0655* (2013.01)

(58) Field of Classification Search
CPC ..... G11C 29/00; G11C 29/003; G11C 29/006; G11C 29/12; G11C 29/14; G11C 29/18; G11C 29/26; G11C 29/28; G11C 29/30; G11C 29/48; G11C 2029/1206; G11C 5/06
See application file for complete search history.

(56) References Cited

U.S. PATENT DOCUMENTS 8,055,966 B1 * 11/2011 Sogani ........... G01R 31/318513
714/733
2015/0287656 A1 * 10/2015 Killingsworth .... G01R 31/2884
324/762.02

* cited by examiner

*Primary Examiner* — Alfredo Bermudez Lozada
(74) *Attorney, Agent, or Firm* — Holland & Hart LLP

(57) ABSTRACT

Command/address (CA) pads of a wafer may be coupled with one or more logic circuits of the wafer to support transmission of a test signal between different memory dies of the wafer. A CA pad of a first memory die may be coupled with a repeater circuit in a scribe region of the wafer, and the repeater circuit may be coupled with a corresponding control circuit in the scribe region. These circuits may support repetition of a signal from a probe card to one or more other CA conductive paths of one or more other memory dies of the wafer. The repeater circuit may receive a test signal from the CA pad, which may be coupled with and receive the test signal from the probe card, and may transmit the test signal to another CA pad of another memory die based on a configuration of the control circuit.

20 Claims, 6 Drawing Sheets

INTERCONNECTED COMMAND/ADDRESS RESOURCES

BACKGROUND

The following relates generally to one or more memory systems and more specifically to interconnected command/address (CA) resources.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
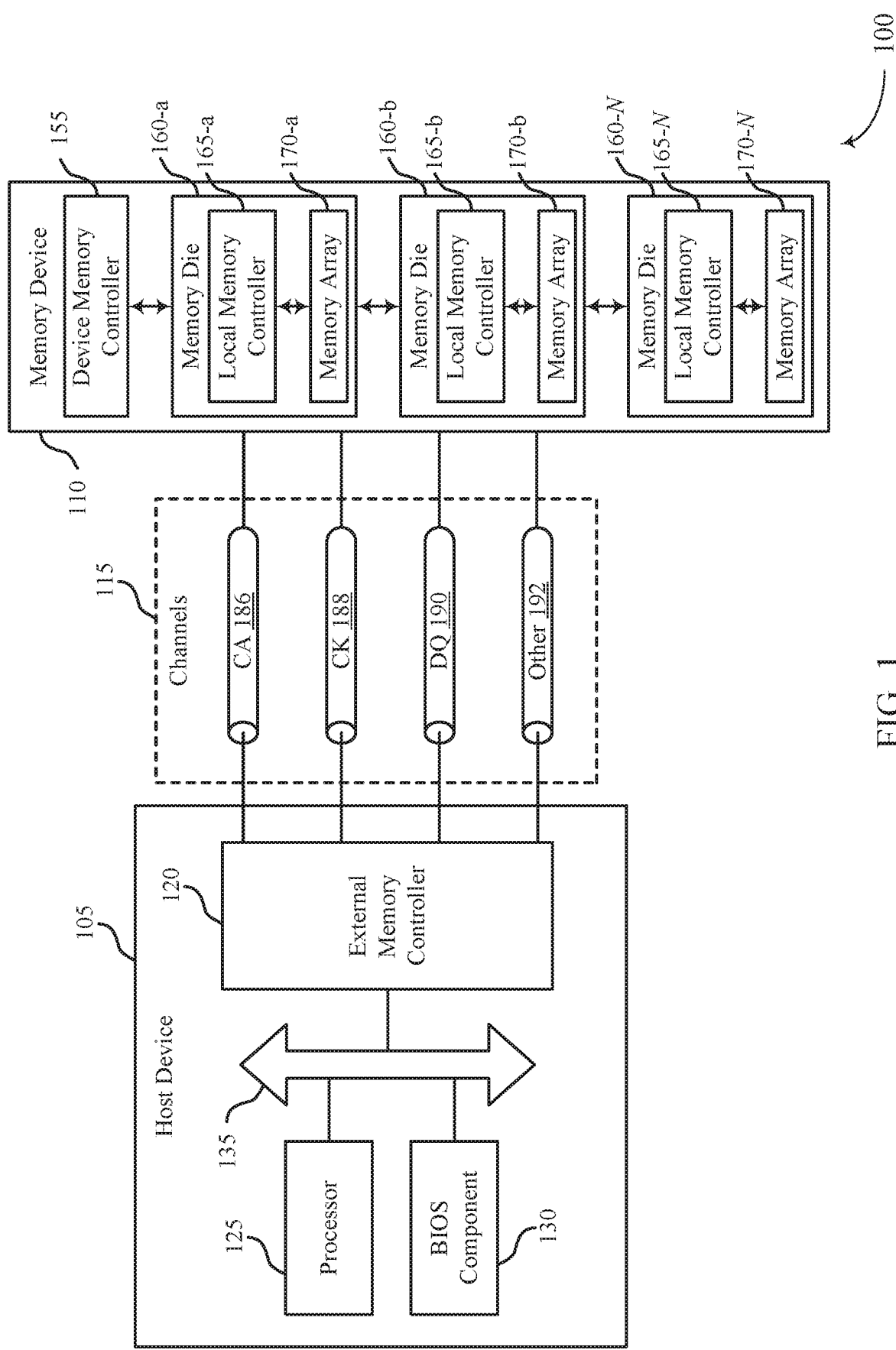
FIG. 1 illustrates an example of a system that supports interconnected command/address (CA) resources in accordance with examples as disclosed herein.

Multiple memory devices may be manufactured at one time on a single wafer. Later, the wafer may be divided into smaller parts that may be used in memory systems. A memory apparatus, such as a wafer, may be tested, among other examples, to determine whether one or more portions of the apparatus function according to a specified configuration. In some cases, an entire wafer may be tested before the wafer is separated into component parts (e.g., separated into memory dies or other memory devices), which may result in increased test performance and increased testing costs. For example, testing at the wafer level may result in higher costs when compared with testing at a memory die level or other memory device level. One example of how testing at the wafer level may increase some costs may include increase a pin count of a probe card used during the testing. Testing at the wafer level may include coupling a probe card with the wafer to provide power to the wafer for one or more testing procedures and to provide an interface for coupling the wafer with a testing apparatus (e.g., a tester). In some cases, a cost of a probe card may be associated with a pin count of the probe card. For example, a probe card with a higher quantity of pins (e.g., a higher pin count) may be associated with a higher cost than a probe card with a lower quantity of pins.

Accordingly, techniques and apparatuses are described herein to support a reduced quantity of pins for a probe card while also testing multiple memory dies of a wafer at one time. For example, a wafer may be configured such that a signal (e.g., a test signal) from the probe card may be received at a first command/address (CA) pad associated with a first memory die of the wafer and may be routed to one or more other CA pads associated with one or more other memory dies of the wafer. The probe card may thus perform a testing procedure for multiple memory dies using one or more pins of the probe card coupled with one or more pads associated with a subset of memory dies being tested (e.g., coupled with a single memory die). In such cases, the probe card may be configured with a reduced quantity of pins in order to test the wafer. Such techniques and apparatuses may reduce a cost of a probe card used to test the wafer, which may reduce overall costs for testing procedures at the wafer level.

The CA pads of the wafer may be included in a redistribution layer (RDL) of the wafer and may be coupled with one or more logic circuits in another region of the wafer via one or more corresponding CA conductive paths (e.g., located in the RDL). A CA pad of a first memory die may be coupled with a repeater logic circuit in a scribe region of the wafer, and the repeater logic circuit may be coupled with a corresponding control logic circuit in the scribe region. Such logic circuits may support transmission or repetition of a signal from the probe card to one or more other CA pads of one or more other memory dies. For example, the repeater logic circuit may receive a test signal from the CA pad (e.g., which may be coupled with the probe card) and may transmit (e.g., forward or repeat) the test signal to another CA pad of another memory die based on a configuration of the control logic circuit. The control logic circuit may control the repeater logic circuit to transmit the test signal to another memory die or to not transmit the test signal, and may further control a direction in which the test signal is transmitted by the repeater logic circuit.

Features of the disclosure are initially described in the context of memory systems and dies as described with reference to FIG. 1. Features of the disclosure are described in the context of a testing configuration, a signaling configuration, memory structures, and logic circuits as described with reference to FIGS. 2-5. These and other features of the disclosure are further illustrated by and described with reference to a flowchart that relate to interconnected CA resources as described with references to FIG. 6.

FIG. 1 illustrates an example of a system 100 that supports interconnected CA resources in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110). In some cases, the system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may be an example of a probe card or testing apparatus (e.g., a tester). For example, the host device 105 may represent a tester, and may be coupled with the memory device 110 via a probe card.

In some examples, the host device 105 may refer to the hardware, firmware, software, or a combination thereof that implements the functions of an external memory controller 120. In some examples, the external memory controller 120 may be referred to as a host or a host device 105. If the host device 105 represents a probe card or a tester, the host device 105 may indicate for the memory device 110 to perform one or more testing functions (e.g., perform read, write, or other commands based on received CA information). For example, the host device 105 may control or run the memory device 110 to execute one or more testing protocols or methods within the memory device 110, and in some cases, the host device 105 may request, from the memory device 110, feedback associated with the testing protocols (e.g., results from the testing protocols).

Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing, or other factors. The memory device 110 may be operable to store data for the components of the host device 105. In some examples, the memory device 110 may act as a slave-type device to the host device 105 (e.g., responding to and executing commands provided by the host device 105 through the external memory controller 120). In some cases, the commands provided by the host device may include one or more testing commands or protocols. Commands from the host device 105 (e.g., test commands) may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be coupled with one another using a bus 135. The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. In some examples, the peripheral components may represent or include a probe card or pins on a probe card. In some cases, the probe card may represent the host device 105 or may be coupled with the host device 105 (e.g., coupled with a tester). The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a desired capacity or a specified capacity for data storage. For example, the memory device 110 may represent a wafer of memory dies 160 and may include a quantity of memory dies 160 (e.g., one thousand memory dies). Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package. The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof.

Examples of components that may be included in the device memory controller 155 or the local memory controllers 165, or both, may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 or the processor 125 (e.g., a tester or a probe card) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 (e.g., a tester or a probe card) and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 (e.g., one or more probe card pins or pads) and one or more pins or pads at the memory device 110. A pin (e.g., pad) may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more CA channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling.

In some examples, CA channels 186 may be operable to communicate commands between the host device 105 (e.g., the tester or probe card) and the memory device 110 including control information associated with the commands (e.g., address information). For example, the CA channel 186 may include a read command with an address of the desired data. In some examples, a CA channel 186 may include any quantity of signal paths to decode one or more of address or command data (e.g., eight or nine signal paths). In some examples, data channels 190 may be operable to communicate one or more of data or control information between the host device 105 and the memory device 110. For example, the data channels 190 may communicate information (e.g., bi-directional) to be written to the memory device 110 or information read from the memory device 110. In some examples, the one or more other channels 192 may include one or more error detection code (EDC) channels. The EDC channels may be operable to communicate error detection signals, such as checksums, to improve system reliability. An EDC channel may include any quantity of signal paths.

Some CA pads of a wafer may be coupled with one or more logic circuits of the wafer that may support transmission of a test signal between CA pads of different memory dies. For example, a CA pad of a first memory die may be coupled with a repeater logic circuit in a scribe region of the wafer, and the repeater logic circuit may be coupled with a corresponding control logic circuit in the scribe region. Such logic circuits may support transmission or repetition of a signal from a probe card to one or more other CA pads of one or more other memory dies. For example, the repeater logic circuit may receive a test signal from the CA pad (e.g., which may be coupled with the probe card) and may transmit (e.g., forward or repeat) the test signal to another CA pad of another memory die based on a configuration of the control logic circuit.

Figure 2:
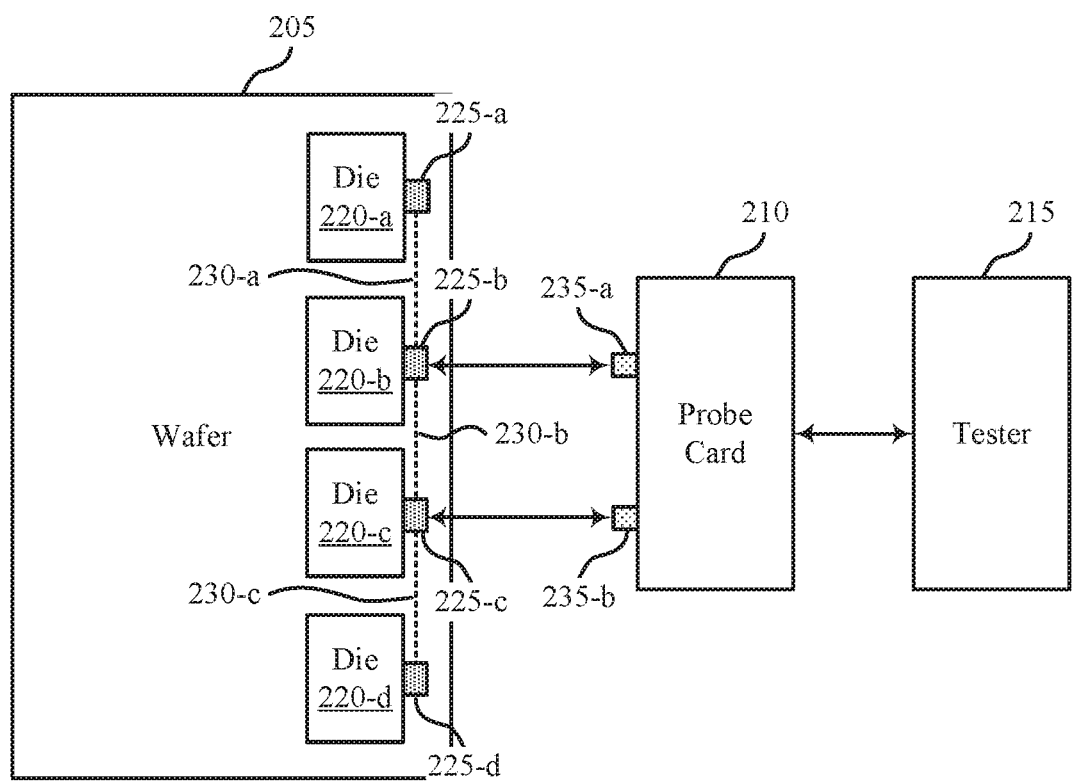
FIG. 2 illustrates an example of a testing configuration that supports interconnected CA resources in accordance with examples as disclosed herein.

FIG. 2 illustrates an example of a testing configuration 200 that supports interconnected CA resources in accordance with examples as disclosed herein. Testing configuration 200 may include a memory wafer 205 that is coupled with a probe card 210, where the probe card 210 may, in turn, be coupled with a tester 215 (e.g., a testing apparatus). A wafer 205 may represent a block or group of memory devices that may be fabricated on a same substrate or platform, where the wafer may be separated into component memory devices by one or more additional fabrication steps. For example, the wafer 205 may include multiple memory dies 220, which may each be an example of a respective memory die 160 described with reference to FIG. 1. In some cases, the wafer 205 may represent a largest manufactured unit of memory devices.

Although the testing configuration 200 is described with reference to memory dies 220, the apparatuses, techniques, and configurations described herein may also apply to any memory device included in a wafer 205. Some methods described herein may be occur during a testing operation (e.g., one or more testing procedures) performed on the wafer 205. For example, the wafer 205 may be configured such that a group of memory dies 220 may be tested by the tester 215 and the probe card 210, where a first subset of the group of memory dies 220 may be coupled with the probe card 210 and a second subset of the group of memory dies 220 may not be directly coupled with the probe card 210.

The memory dies 220 of the wafer 205 may each include or be associated with one or more CA pads 225 (e.g., communication pads or pins). A CA pad 225 illustrated in FIG. 2 may represent a single CA pad 225 or multiple CA pads 225 associated with a respective memory die 220. A CA pad 225 may interface with the probe card 210 (e.g., a host device as described with reference to FIG. 1). For example, a CA pad 225, or multiple CA pads 225, associated with a memory die 220 may be coupled with or otherwise interface with one or more portions (e.g., pads or pins) of the probe card 210. A CA pad 225 (e.g., or a group of CA pads 225) associated with a first memory die 220 may also be selectively couplable with a CA pad 225 (e.g., or a group of CA pads 225) associated with one or more second memory dies 220. For example, one or more logic circuits 230 in a scribe region (e.g., a removable region) of the wafer 205 may be configured to selectively couple the CA pad 225 (e.g., or group of CA pads 225) of the first memory die 220 with the CA pad 225 (e.g., or group of CA pads 225) of the one or more second memory dies 220.

In some examples, a CA pad 225-*a* of memory die 220-*a* and a CA pad 225-*b* of memory die 220-*b* via may be selectively couplable via one or more logic circuits 230-*a*. Similarly, a CA pad 225-*c* of memory die 220-*c* may be selectively couplable with CA pad 225-*b* and with a CA pad 225-*d* of memory die 220-*d* via one or more logic circuits 230-*b* and 230-*c*, respectively. The example illustrated in FIG. 2 shows four memory dies 220, however, the wafer 205 may include any quantity of memory dies 220 and corresponding CA pads 225, where a CA pad 225 of a memory die 220 may be selectively couplable with one or more CA pads 225 of other memory dies 220.

The probe card 210 may include multiple pins 235 (e.g., pads, balls, or other means for coupling) that may interface with (e.g., couple with) one or more corresponding CA pads 225 on the wafer 205 (e.g., CA pads 225-*b* and 225-*c*). The probe card may further be coupled with or interface with a testing device or apparatus (e.g., tester) 215. The tester 215 may represent a computer, a processor, a general-purpose testing device, a special-purpose testing device, or any other testing device or apparatus. In some cases, the tester 215 may control the probe card 210 or may include the probe card 210.

The probe card 210 may configure the wafer 205 for testing, for example, by transmitting a test configuration to the wafer 205 as indicated by the tester 215 (e.g., a test configuration determined by the tester 215 or input into the tester 215, such as by a user). The probe card 210 may transmit a test signal to the wafer 205 (e.g., to one or more memory dies 220 of the wafer 205) via one or more CA pads 225 (e.g., CA pads 225-*b* and 225-*c*), and the one or more memory dies 220 of the wafer 205 may perform a command indicated by the signal (e.g., a read command, write command, or other command). In some cases, data may be generated by the wafer 205 (e.g., or components of the wafer 205) during the testing operation and in response to a test signal, and may be transmitted (e.g., via one or more DQ pads or other pads) back to the probe card 210 (e.g., and corresponding tester 215).

In some cases, the test configuration may indicate that a first memory die 220 and associated CA pad 225 are to repeat a signal received from the probe card 210 to a second CA pad 225 associated with a second memory die 220 that may not be coupled (e.g., directly coupled) with the probe card 210. For example, the test configuration may indicate for CA pad 225-*b* (e.g., associated with memory die 220-*b*) to forward or repeat a test signal to CA pad 225-*a* (e.g., associated with memory die 220-*a*). Similarly, the test configuration may indicate for CA pad 225-*c* (e.g., associated with memory die 220-*c*) to forward or repeat a test signal to CA pad 225-*d* (e.g., associated with memory die 220-*d*). The test signal may be repeated via one or more logic circuits 230 as described herein.

A probe card 210 may test (e.g., transmit test signals or commands to) one or more memory dies 220 or associated CA pads 225 that may not be directly coupled with the probe card 210. Accordingly, a quantity of pins 235 on the probe card 210 may be less than a total quantity of CA pads 225 that may be tested using the quantity of pins 235 on the probe card 210. For example, pins 235-*a* and 235-*b* of the probe card may be respectively coupled with CA pads 225-*b* and 225-*c* of the wafer. The probe card 210 (e.g., as indicated by the tester 215) may transmit a signal via CA pads 225-*b* and 225-*c*, and the one or more logic circuits 230-*a* and 230-*c* may forward the signal to CA pads 225-*a* and 225-*d*, respectively. Thus a test signal may be received by one or more CA pads 225 (e.g., and one or more associated memory dies 220) that are not directly coupled with the probe card 210.

Figure 3:
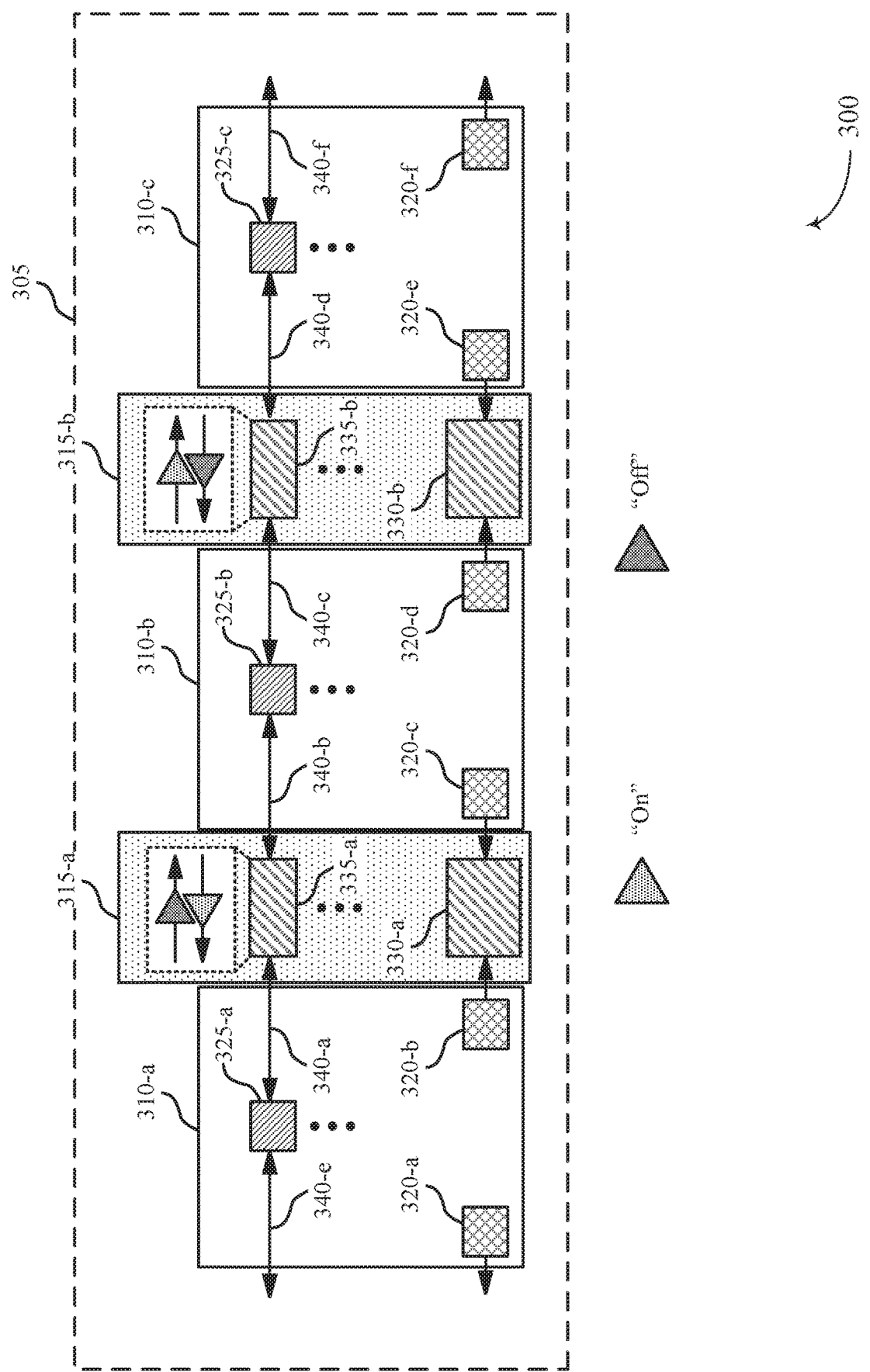
FIG. 3 illustrates an example of a signaling configuration that supports interconnected CA resources in accordance with examples as disclosed herein.

FIG. 3 illustrates an example of a signaling configuration 300 that supports interconnected CA resources in accordance with examples as disclosed herein. Signaling configuration 300 may represent a configuration of a wafer 305, such as a wafer described with reference to FIGS. 1 and 2. The wafer 305 may include multiple memory dies 310 and associated circuitry. Although the signaling configuration 300 is described with reference to memory dies 310, the apparatuses, techniques, and configurations described herein may also apply to any memory device included in a wafer 305. The wafer 305 may be configured such that a pin of a probe card may interface or couple with (e.g., during a testing procedure) a first CA pad 325 associated with a first memory die 310 and may transmit a signal, via the first CA pad 325, to one or more other CA pads 325 that may not be directly coupled with the probe card and that may be associated with one or more other memory dies 310.

A memory apparatus, such as the wafer 305, may be tested for quality control, for example, to determine whether one or more portions of the wafer 305 function according to a specified configuration. In some cases, the wafer 305 may be tested for other purposes. Testing of the wafer 305 (e.g., performing one or more testing procedures) may occur at a specific time in a manufacturing process of the wafer 305. For example, a testing time may be chosen such that certain testing results or cost characteristics may be achieved when performing a testing procedure. In some cases, testing of the wafer 305 may occur before the wafer 305 is separated into component parts (e.g., separated into memory dies 310, groups of memory dies 310, or other memory devices). Such testing may support improved testing results and testing processes, among other examples.

In some cases, performing the one or more testing procedures at a wafer level (e.g., before separating the wafer 305) may result in increased testing costs. For example, testing at the wafer level may result in a probe card having a higher quantity of pins, which may increase the cost of performing the tests. For example, testing at the wafer level may include coupling a probe card with the wafer 305 or with a portion of the wafer 305 to test the wafer 305 (e.g., or to test a portion of the wafer 305). The probe card may provide power to the wafer 305 for the one or more testing procedures and may also provide an interface for coupling the wafer 305 with a testing apparatus (e.g., a tester). In some cases, each different design of a memory device or wafer 305 may correspond to a respective, different probe card design. The probe card may result in increased testing costs at the wafer level due to a complexity of the probe card and associated cost of manufacturing the probe card, among other examples. In some cases, a cost of a probe card may be associated with a pin count of the probe card. For example, a probe card with a higher quantity of pins (e.g., a higher pin count) may be associated with a higher cost than a probe card with a lower quantity of pins.

Accordingly, techniques and apparatuses are described herein to support a reduced quantity of pins for a probe card. For example, the wafer 305 may be configured such that a signal from the probe card (e.g., transmitted from the tester via the probe card) may be received by a first CA pad 325 associated with a first memory die 310 of the wafer 305 and may be routed to one or more other CA pads 325 (e.g., associated with one or more other memory dies 310) of the wafer 305. Such techniques may share CA resources for test signal transmission, which may support a higher quantity of parallel operations for testing procedures and a corresponding reduction in tester resources (e.g., probe card pins and/or tester protocols).

The probe card may thus perform a testing procedure for multiple CA pads 325 (e.g., and associated multiple memory dies 310) using one pin of the probe card (e.g., coupled with one CA pad 325 on the wafer 305). Accordingly, a quantity of probe card pins used to test CA resources (e.g., CA pads 325) may be lower than an associated quantity of tested CA pads 325 (e.g., a quantity or count of CA pads 325 on the wafer 305). The probe card may therefore be configured with a reduced quantity of pins in order to test the wafer 305 (e.g., compared to examples where signals may not be routed between CA pads 325 on different memory dies 310). For example, an average quantity of probe card pins associated with a memory die 310 on the wafer 305 may be reduced from 14 pins on average to five pins, three pins, or two pins on average. Such techniques and apparatuses may reduce a cost of a probe card used to test the wafer 305, which may reduce overall costs for performing testing procedures at the wafer level.

The wafer 305 may include different regions (e.g., units) of memory dies 310 and associated circuitry. For example, the wafer 305 may include one or more regions that include the memory dies 310 (e.g., or memory devices) of the wafer 305 and may include one or more regions that include other circuitry. The one or more regions may include scribe regions 315, where a scribe region 315 may represent a portion of the wafer 305 that may be removed when the wafer 305 is separated into memory dies 310 or memory devices. A scribe region 315 may include circuitry that may be used to repeat a test signal (e.g., a signal or command associated with a testing procedure) from a first CA pad 325 of a first memory die 310 to a second CA pad 325 of a second memory die 310.

Each memory die 310 may include one or more respective CA pads 325 and one or more respective signal pads 320. A CA pad 325 or a signal pad 320 may, in some cases, be coupled with the probe card when performing a testing procedure. In some cases, a CA pad 325 may receive a test signal from the probe card, and a signal pad 320 may receive a testing configuration signal from the probe card. A CA pad 325 or a signal pad 320 may be coupled with circuitry in a scribe region 315 that may support transmitting (e.g., repeating or forwarding) a signal to one or more other CA pads 325 of one or more other memory dies 310. The CA pads 325 and the signal pads 320 may be included in an RDL of the wafer 305 that may be coupled with each of the memory dies 310 of the wafer 305. The RDL may represent a highest metal layer of the wafer 305 and may redistribute signals to other resources located in or coupled with the RDL. The RDL is further described herein with reference to FIG. 4.

A scribe region 315 may include a logic circuit for repeating or forwarding a signal to one or more other CA pads 325 on one or more memory dies 310. The logic circuit may include a control circuit 330 (e.g., a first subset or a first circuit) and a repeater circuit 335 (e.g., a second subset or a second circuit). In some cases, the repeater circuit 335 may be included in non-scribe regions of the wafer 305 (e.g., may be included on-chip). The control circuit 330 may represent a circuit used to indicate a direction a test signal is to be forwarded or repeated. In some cases, the control circuit 330 may indicate that a test signal is not to be forwarded or repeated (e.g., is to be isolated). The control circuit 330 may be hardwired with such signal control information or may be configured with signal control information by the testing configuration signal.

The repeater circuit 335 may receive a test signal from a CA pad 325 of a memory die 310 (e.g., a CA pad 325 coupled with the probe card) and may transmit (e.g., forward or repeat) the test signal to another CA pad 325 (e.g., of another memory die 310), for example, based on the configuration of a control circuit 330 associated with the repeater circuit 335. For example, the associated control circuit 330 may, in some cases, control the repeater circuit 335 to repeat the test signal to another memory die 310 (e.g., a memory die 310 located to the left or right of the memory die 310) or to suppress retransmission of the test signal. In some cases, a memory die 310 of the wafer 305 may be configured such that each CA pad 325 of the memory die 310 is coupled with a corresponding control circuit 330 and repeater circuit 335 for each associated neighboring memory die 310. For example, a memory die 310 may be associated with 14 CA pads 325, and each of the 14 CA pads may be respectively coupled with one control circuit 330 and one repeater circuit 335 for driving left and one control circuit 330 and one repeater circuit 335 for driving right (e.g., each memory die may be associated with 28 control circuits 330 and 28 repeater circuits 335).

In one example, a CA pad 325-b (e.g., associated with memory die 310-b) may be coupled with the probe card. The CA pad 325-b may be coupled with repeater circuits 335-a and 335-b in scribe regions 315-a and 315-b, respectively, via CA conductive paths 340-b and 340-c, respectively. In some cases, signal pads 320-c and 320-d of memory die 310-b may be coupled with the probe card. Signal pads 320-c and 320-d may, in some cases, receive a testing configuration from the probe card indicating a configuration or a portion of a configuration for control circuits 330-a and 330-b. In some cases, signal pads 320-b and 320-e may also receive a testing configuration from the probe card indicating a configuration or a portion of a configuration for control circuits 330-a and 330-b. In some cases, control circuits 330-a and 330-b may be hardwired with a configuration indicating a signal direction.

Control circuits 330-a and 330-b may be configured (e.g., according to the received testing configuration or hardwired) with a direction for respective repeater circuits 335-a and 335-b to repeat or forward a test signal. For example, control circuit 330-a may be configured to support repetition of the test signal from memory die 310-b to memory die 310-a (e.g., drive the test signal left), but may not be configured to support repetition from memory die 310-a to 310-b (e.g., drive the test signal right). Similarly, control circuit 330-b may be configured to support repetition of the test signal from memory die 310-b to memory die 310-c (e.g., drive the test signal right), but not from memory die 310-c to 310-b (e.g., drive the test signal left). For example, this configuration may include control circuit 330-a being configured with drive left "on" and drive right "off," as well as control circuit 330-b being configured with drive left "off" and drive right "on."

Accordingly, CA pad 325-b may receive a test signal from the probe card and the signal may be routed from CA pad 325-b to repeater circuits 335-a and 335-b (e.g., via CA conductive paths 340-b and 340-c, respectively). Control circuit 330-a, based on the described control configuration, may control the repeater circuit 335-a (e.g., via one or more control signals) to repeat the test signal to the left (e.g., to memory die 310-a), but not to the right. Similarly, control circuit 330-b may control the repeater circuit 335-b (e.g., via one or more control signals) to repeat the test signal to the right (e.g., to memory die 310-c), but not to the left. Accordingly, repeater circuit 335-a may repeat the test signal to CA conductive path 340-a and CA pad 325-a and repeater circuit 335-b may repeat the test signal to CA conductive path 340-d and CA pad 325-c. In some cases, other control circuits 330 and repeater circuits 335 associated with memory dies 310-a and 310-c may be configured to stop repetition of the test signal beyond memory dies 310-a and 310-c (e.g., the other associated control circuits 330 may be configured with drive left or drive right as "off"). For example, the test signal may be shared among three memory dies 310 (e.g., memory dies 310-a, 310-b, and 310-c) and may not be transmitted to other memory dies 310.

In some cases, one or more control circuits 330 and repeater circuits 335 may be used to isolate a memory die 310 from a test signal. As such, the one or more control circuits 330 may be configured to control the corresponding one or more repeater circuits 335 to be in an isolation state, or to not repeat the test signal. In some cases, the isolation configuration may be used to exclude a memory die 310 from testing procedures when the memory die 310 is known to be a bad die.

While the example illustrated in FIG. 3 shows three memory dies 310 included in the wafer 305, it is to be understood that any quantity of memory dies 310 may be included in the wafer. For example, the wafer 305 may include one thousand or more memory dies 310. Similarly, the example of selectively coupling CA resources (e.g., CA pads 325, signal pads 320, and CA conductive paths 340) for test signal transmission between three memory dies 310-a, 310-b, and 310-c may be extended to sharing (e.g., selectively coupling) CA resources for test signal propagation between any quantity of memory dies 310. For example, five memory dies 310 or seven memory dies 310 may share CA resources for test signal propagation (e.g., test signal repetition, forwarding, or transmission to other memory dies 310). In some cases, all the memory dies 310 included in the wafer 305 may share CA resources. In the example of three memory dies 310 sharing CA resources for test signal propagation, a quantity of probe card pins per memory die 310 may be five pins. In the example of five memory dies 310 sharing CA resources, a quantity of probe card pins per memory die 310 may be three pins, and in the example of seven memory dies 310 sharing CA resources, a quantity of probe card pins per memory die may be two pins. Accordingly, a quantity of probe card pins may be reduced compared with other configurations that do not share CA resources.

In some cases, a larger quantity of memory dies 310 with shared CA resources may result in greater signal propagation delay. As such, a quantity of memory dies 310 with shared CA resources may be based on a desired pin count for the probe card and a desired propagation delay or propagation speed for the test signal.

In some cases, CA resources (e.g., CA pads 325, signal pads 320, and CA conductive paths 340) may be shared among memory dies 310 by coupling multiple CA pads 325 and/or signal pads 320 of one memory die 310 to the probe card. The wafer 305 may be configured to repeat test signals from the multiple CA pads 325 to one or more other CA pads 325 on other memory dies 310. In some cases, CA pads 325 and/or signal pads 320 of multiple memory dies 310 may be coupled with the probe card to support distribution of pin density across the wafer 305 and the probe card. In such cases, the wafer 305 may similarly be configured to repeat test signals from the CA pads 325 to one or more other CA pads 325 on other memory dies 310.

In some cases, one or more test signals may be multiplexed (e.g., via address skipping) when transmitted to the wafer 305 (e.g., via one or more CA pads 325). The multiplexing may support an even lower pin count on the probe card because a larger quantity of information may be transmitted via a multiplexed test signal. In some cases, multiplexing the one or more test signals may increase complexity of addressing circuitry on the memory dies 310 of the wafer 305 or may increase a time duration for testing procedures. As such, a quantity of multiplexed test signals may be based on a desired pin count for the probe card and a desired complexity or cost associated with the wafer 305.

Figures 4A, 4B:
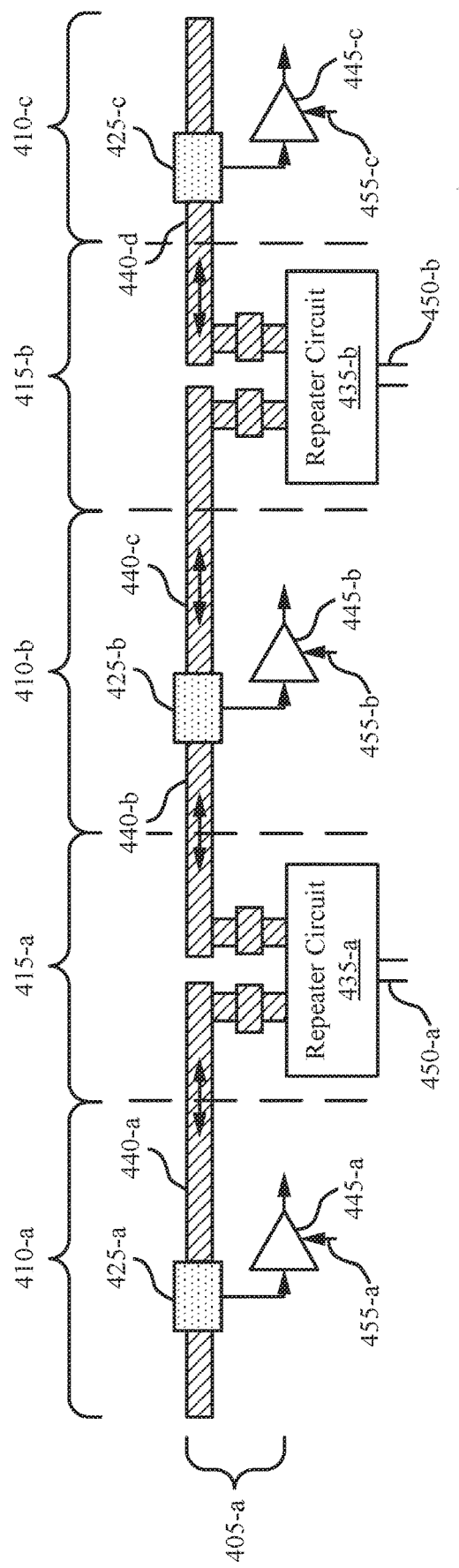
FIGS. 4A and 4B illustrate respective examples of memory structures that support interconnected CA resources in accordance with examples as disclosed herein.

FIGS. 4A and 4B illustrate respective examples of memory structures 401 and 402 that support interconnected CA resources in accordance with examples as disclosed herein. Memory structures 401 and 402 may represent structures included in a wafer, which may represent a wafer described with reference to FIGS. 1-3. As described with reference to FIGS. 1-3, the wafer may be configured such that a pin of a probe card may interface or couple with a first CA pad 425 of a first memory die (e.g., during a testing procedure) and may transmit a signal, via the first CA pad 425, to one or more other CA pads 425 (e.g., associated with one or more other memory dies) that may not be directly coupled with the probe card. Although the memory structures 401 and 402 are described with reference to memory dies, the apparatuses, techniques, and configurations described herein may also apply to any memory device included in a wafer.

The structures on the wafer may include different regions (e.g., units) associated with memory dies or with other circuitry. For example, the wafer may include memory die regions 410 that include structures associated with memory dies (e.g., or memory devices) of the wafer. The wafer may also include scribe regions 415 that include circuitry associated with testing the memory dies (e.g., or memory devices). The scribe regions 415 may be removed when the wafer is separated into memory dies or memory devices and may include circuitry for transmitting a test signal between CA pads 425 of different memory dies. The scribe regions 415 may, in some cases, include all of the materials or layers within a corresponding region of the wafer.

A memory die region 410 may include one or more respective CA pads 425 and one or more respective signal pads 420. A CA pad 425 or a signal pad 420 may, in some cases, be coupled with the probe card when performing a testing procedure. In some cases, a CA pad 425 may receive a testing signal from the probe card, and a signal pad 420 may receive a testing configuration signal from the probe card. The CA pads 425 and the signal pads 420 may be included in an RDL 405 that may form part of the wafer and may be coupled with each of the memory dies of the wafer. The RDL 405 may represent a highest or top metal material of the wafer, and conductive lines and/or traces in the RDL 405 may redistribute signals to other resources located in or coupled with the RDL 405. In some cases, the RDL 405 may reduce drops in signal power, for example, compared to transmitting signals via one or more other portions of the wafer. For example, the RDL 405 may include larger features or components (e.g., compared to other materials) and the larger features or components may drive a higher current without a corresponding higher power drop (e.g., compared to other materials). A CA pad 425 or a signal pad 420 in the RDL 405 may be coupled with circuitry within a scribe region 415 that may support transmitting a test signal between CA pads 425 or signal pads 420 of different memory dies.

For example, the RDL 405 may include a CA conductive path 440 that may couple a CA pad 425 with circuitry in a scribe region 415. In some cases, a CA conductive path 440 may also couple a CA pad 425 with a buffer 445. A CA conductive path 440 may additionally couple a signal pad 420 with circuitry in a scribe region 415. The circuitry in the scribe region 415 may be positioned below the RDL 405, such as in a lower material in the stack of materials of the wafer, and may be coupled with the RDL 405, such as via a respective CA conductive path 440.

The circuitry in the scribe region 415 may include a logic circuit for transmitting a signal between CA pads 425 on different memory dies. The logic circuit may include a control circuit 430 (e.g., a first subset or a first circuit) and a repeater circuit 435 (e.g., a second subset or a second circuit). The control circuit 430 may represent a circuit used to indicate a direction a test signal is to be transmitted, or used to indicate that a test signal is not to be transmitted to another memory die (e.g., is to be isolated). The repeater circuit 435 may receive a test signal from a CA pad 425 (e.g., a CA pad 425 in a first memory die region 410, that is coupled with the probe card) via a CA conductive path 440. The repeater circuit 435 may forward or repeat the test signal to another CA pad 425 and CA conductive path 440 (e.g., in another memory die region 410), for example, based on the configuration of a control circuit 430 associated with the repeater circuit 435.

The CA pads 425, signal pads 420, control circuits 430, and repeater circuits 435 may be examples of the corresponding structures described with reference to FIG. 3. For example, the CA pads 425, signal pads 420, control circuits 430, and repeater circuits 435 described with reference to FIG. 4 may be configured or otherwise constructed to perform one or more of the methods for transmitting (e.g., repeating or forwarding) a test signal or other signal between memory dies (e.g., between memory die regions 410).

In one example, a CA pad 425-*b* in a memory die region 410-*b* may be coupled with multiple repeater circuits 435. For example, CA pad 425-*b* may be coupled with repeater circuits 435 associated with neighboring memory die regions 410, such as repeater circuits 435-*a* and 435-*b*, which may selectively couple the memory die region 410-*b* with memory die regions 410-*a* and 410-*c*, respectively. The CA pad 425-*b* may be coupled with repeater circuits 435-*a* and 435-*b* via CA conductive paths 440-*b* and 440-*c*, respectively. In some cases, CA pad 425-*b* and CA conductive paths 440-*b* and 440-*c* may be included in the RDL 405. Similar configurations may exist for other CA pads 425, corresponding memory die regions 410, and scribe regions 415. For example, a memory die region 410-*a* may include a CA pad 425-*a*, which may be coupled with one or more repeater circuits 435 (e.g., repeater circuit 435-*a*) via one or more CA conductive paths 440 (e.g., CA conductive path 440-*a*). Similarly, a memory die region 410-*c* may include a CA pad 425-*c*, which may be coupled with one or more repeater circuits 435 (e.g., repeater circuit 435-*b*) via one or more CA conductive paths 440 (e.g., CA conductive path 440-*d*).

A control circuit 430 may be coupled with multiple signal pads 420 in a memory die region 410-*e*. For example, control circuit 430-*b* may be coupled with signal pads 420 associated with neighboring memory die regions 410, such as signal pads 420-*c* and 420-*d*, where the control circuit 430-*b* may selectively couple the memory die region 410-*e* with memory die region 410-*f*. Signal pads 420-*c* and 420-*d* may be coupled with control circuit 430-*b* via respective control signal conductive paths 460-*c* and 460-*d*. In some cases, the signal pads 420 and the control signal conductive paths 460 may be included in the RDL 405. Similar configurations may exist for other signal pads 420, corresponding memory die regions 410, and scribe regions 415. For example, a memory die region 410-*d* may include a signal pad 420-*a*, which may be coupled with a control circuit 430-*a* via control signal conductive path 460-*a*. Similarly, memory die region 410-*e* may include a signal pad 420-*b*, which may be coupled with control circuit 430-*b* via control signal conductive path 460-*b*.

A CA pad 425 may also be coupled with a buffer 445 that may, in some cases, be located in the RDL 405. For example, CA pad 425-*a* may be coupled with a buffer 445-*a*, CA pad 425-*b* may be coupled with a buffer 445-*b*, and CA pad 425-*c* may be coupled with a buffer 445-*c*. A buffer 445 may couple the CA pad 425 in the RDL 405 with one or more internal CA resources. In some cases, buffering may be configurable to use hard or soft ties to control a buffer 445, for example, based on available resources. After wafer processing is finished (e.g., the wafer is separated into component parts), a buffer 445 and an associated CA pad 425 may be in a disabled or inert state. For example, during testing, a buffer may receive a signal 455 (e.g., asserted as a part of the testing) that may activate the buffer 445 and may couple the associated CA pad 425 with internal CA resources. After testing is completed, the signal 455 may be de-asserted, which may render the buffer 445 and corresponding CA pad 425 inert and may decouple the buffer 445 and the CA pad 425 from the internal CA resources.

In some cases, a memory die region 410 or scribe region 415 illustrated by FIG. 4A may correspond to a memory die region 410 or scribe region 415 illustrated by FIG. 4B. For example, memory die regions 410-a, 410-b, and 410-c may respectively correspond to memory die regions 410-d, 410-e, and 410-f, and in some cases may represent a different portion or subset of a same memory die region 410. For example, corresponding memory die regions 410 may each represent a subset of the same memory die region 410, but at a different location within a plane of the memory die region 410 (e.g., a different location within a plane of the RDL 405 or another material). Similarly, scribe regions 415-a and 415-b may respectively correspond to scribe regions 415-c and 415-d, and in some cases may represent a different portion or subset of a same scribe region 415. For example, corresponding scribe regions 415 may each represent a subset of the same scribe region 415, but at a different location within a plane of the scribe region 415 (e.g., a different location within a plane of the RDL 405 or another material).

A control circuit 430 and a repeater circuit 435 corresponding to a same scribe region 415 may be coupled via one or more conductive paths 450. For example, control circuit 430-a and repeater circuit 435-a may be coupled via one or more conductive paths 450-a or 450-c. Similarly, control circuit 430-b and repeater circuit 435-b may be coupled via one or more conductive paths 450-b or 450-d. In some cases, an associated control circuit 430 and repeater circuit 435 may be included in a same material of the wafer (e.g., same layer). For example, in some cases, an associated control circuit 430 and repeater circuit 435 may be included in one or more active silicon materials of the wafer (e.g., active silicon layers).

In some cases, after the scribe regions 415 are removed (e.g., for further processing of the wafer), the CA conductive paths 440 previously coupled with the repeater circuits 435 and control circuits 430 (e.g., removed with the scribe regions 415) may be left floating or may be coupled with a buffer, among other examples. In some cases, the repeater circuits 435 and control circuits 430 may be located in non-scribe regions of the wafer (e.g., memory die regions 410), for example, based on available area in one or more other active regions of the wafer. In such cases, the repeater circuits 435 and control circuits 430 may remain after removing the scribe regions 415 from the wafer.

Figure 5A:
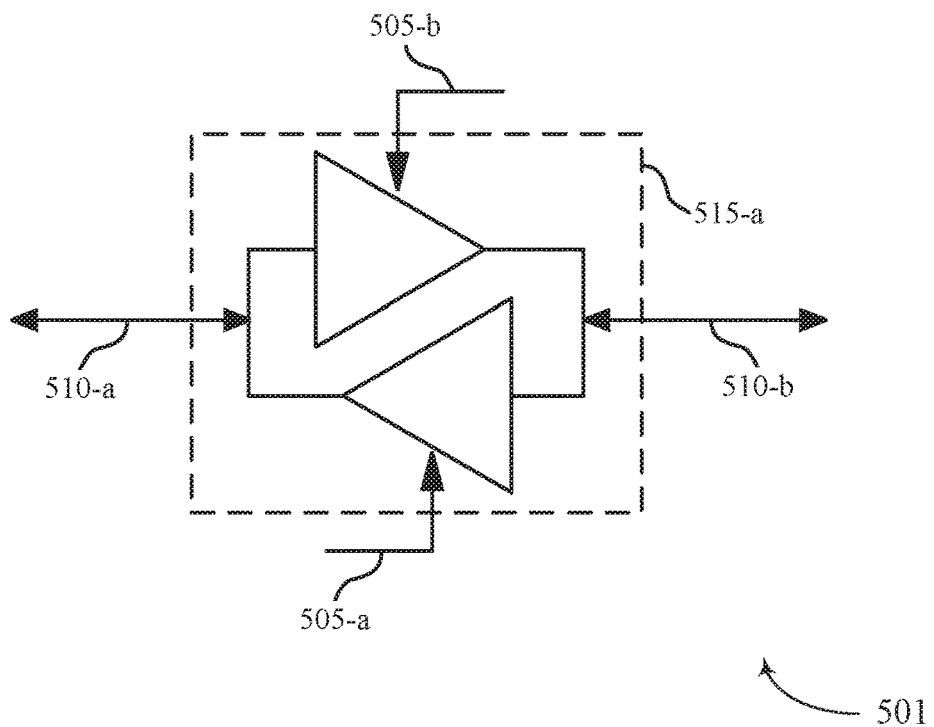
FIGS. 5A and 5B illustrate respective examples of logic circuits that support interconnected CA resources in accordance with examples as disclosed herein.
Figure 5B:
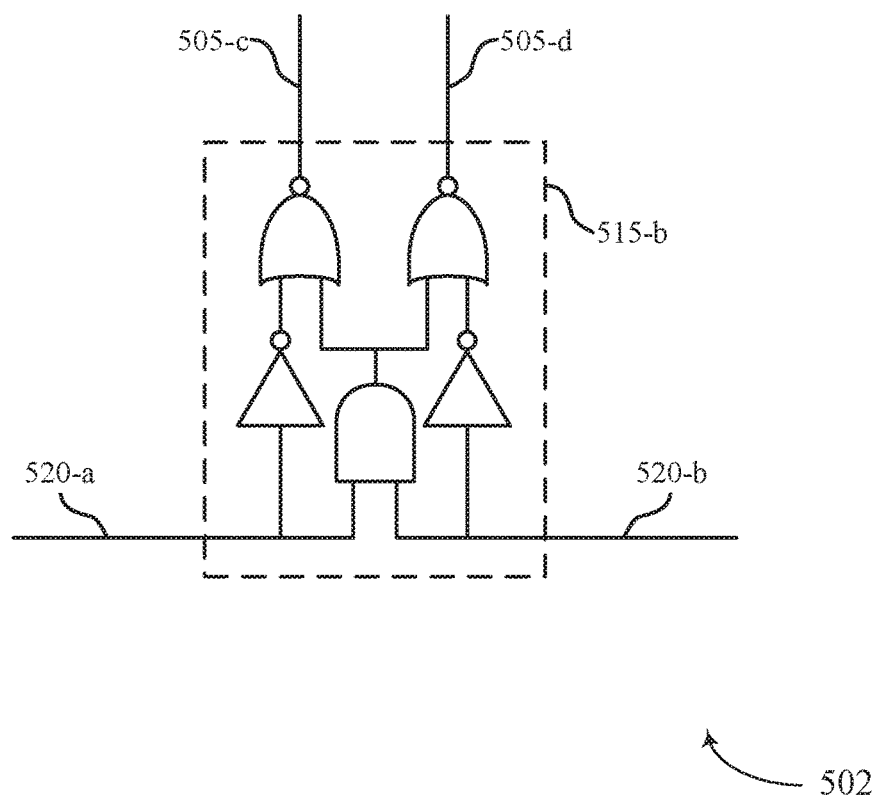

FIGS. 5A and 5B illustrates respective examples of logic circuits 501 and 502 that support interconnected CA resources in accordance with examples as disclosed herein. In some cases, as described with reference to FIGS. 3 and 4, logic circuits 501 and 502 may be located between two neighboring memory dies. For example, logic circuits 501 and 502 may be included in a scribe region of a wafer that is coupled with two neighboring memory dies. Logic circuits 501 and 502 may occupy one or more active materials (e.g., layers) of silicon within the scribe region and may be removed from the wafer with the scribe region (e.g., during dicing that may occur after testing). In some cases, as described with reference to FIGS. 3 and 4, logic circuits 501 and 502 may be included within the circuitry of a memory die.

As illustrated in FIG. 5A, logic circuit 501 may include control conductive paths 505-a and 505-b, CA conductive paths 510-a and 510-b, and logic sub-circuitry 515-a, where logic sub-circuitry 515-a may be coupled with control conductive paths 505-a and 505-b and CA conductive paths 510-a and 510-b. Logic circuit 501 may represent a repeater circuit described with reference to FIGS. 3 and 4. For example, logic circuit 501 may be configured to repeat or transmit a signal from a first CA pad associated with a first memory die to a second CA pad associated with a second memory die by selectively coupling the first and second CA pads and associated CA conductive paths 510. In some cases, logic sub-circuitry 515-a may include one or more conductive paths and one or more amplifiers (e.g., as illustrated in FIG. 5A), among other components.

Logic circuit 501 may receive a control signal from logic circuit 502 via control conductive path 505-a or 505-b, or both, where the control signal may configure the logic circuit 501 to repeat or suppress repetition of a test signal from a first CA pad associated with a first memory die to a second CA pad associated with a second memory die. The first CA pad may be coupled with a pin of a probe card and may receive a test signal from the probe card (e.g., via the pin). Logic circuit 501 may receive the test signal from the first CA pad via a first CA conductive path 510 that couples the first CA pad with logic circuit 501 (e.g., CA conductive path 510-a or 510-b). In some cases, logic circuit 501 may forward or transmit the test signal to the second CA pad via a second CA conductive path 510 that couples the logic circuit 501 with the second CA pad (e.g., CA conductive path 510-a or 510-b), based on the received control signal.

For example, if the control signal is received via control conductive path 505-a, the test signal may be forwarded to the second CA pad via CA conductive path 510-a (e.g., to the left of the first memory die and first CA pad). Similarly, if the control signal is received via control conductive path 505-b, the test signal may be forwarded to the second CA pad via CA conductive path 510-b (e.g., to the right of the first memory die and the first CA pad). In some cases, if the control signal is received via both control conductive paths 505-a and 505-b (e.g., if the control signal drives both control conductive paths 505-a and 505-b to a low voltage), the test signal may be suppressed from being transmitted (e.g., repeated or forwarded) to the second CA pad and memory die. Similarly, if no control signal is received via either control conductive path 505-a or 505-b, the test signal may be suppressed from being transmitted (e.g., repeated or forwarded) to the second CA pad.

In some cases, the control signal may include a voltage pulse or a voltage level and may configure the logic sub-circuitry 515-a to propagate or suppress propagation of the test signal to the second CA pad. For example, a voltage pulse transmitted via control conductive path 505-a may configure the logic sub-circuitry 515-a to open current flow from right to left (e.g., may activate an amplifier or other component of logic sub-circuitry 515-a). Accordingly, the test signal may travel from the first CA pad (e.g., the CA pad interacting directly with the probe) to the second CA pad located to the right of the first memory die and CA pad. Similarly, a voltage pulse transmitted via control conductive path 505-b may configure the logic sub-circuitry 515-a to open current flow from left to right (e.g., may activate an amplifier or other component of logic sub-circuitry 515-a), such that the test signal may travel from the first CA pad to the second CA pad located to the left of the first memory die and CA pad.

As illustrated in FIG. 5B, logic circuit 502 may include control conductive paths 505-c and 505-d, control signal conductive paths 520-a and 520-b, and logic sub-circuitry 515-b, where logic sub-circuitry 515-b may be coupled with control conductive paths 505-c and 505-d and control signal conductive paths 520-a and 520-b. Logic circuit 502 may represent a control circuit described with reference to FIGS. 3 and 4 and may be configured to transmit a control signal to logic circuit 501 to control signal transmission between CA pads of neighboring memory dies. In some cases, logic circuit 502 may receive control information indicating a signal propagation configuration and in some cases, logic circuit 502 may be hardwired with a configuration for propagating a signal.

Control conductive paths 505-c and 505-d may be coupled with or represent a portion of control conductive paths 505-a and 505-b, such that logic circuit 502 may be coupled with logic circuit 501 via respective control conductive paths 505. The control signal conductive paths 520-a and 520-b may be coupled with respective signal pads on the first and second memory dies. In some cases, logic sub-circuitry 515-b may include one or more conductive paths, one or more AND gates, one or more not or (NOR) gates, and one or more inverters, among other components (e.g., as illustrated in FIG. 5B). In some cases, the one or more components of logic sub-circuitry 515-b may be configured to receive a test configuration (e.g., including control information) and use the test configuration to generate a control signal for logic circuit 501. In some cases, the one or more components of logic sub-circuitry 515-b may be configured (e.g., hardwired) with a specific configuration for generating a control signal for logic circuit 501.

In some examples, as described herein, logic circuit 502 may receive control information from a tester (e.g., via a probe card). For example, the tester may transmit a testing configuration to logic circuit 502 via CA resources, such as one or more signal pads and control signal conductive paths 520 (e.g., control signal conductive paths 520-a and/or 520-b). In some examples, as described with reference to FIGS. 3 and 4, there may be two signal pads coupled with each logic circuit 502. The first signal pad may be associated with the first memory die and may be coupled with logic circuit 502 via a first control signal conductive path 520 (e.g., control signal conductive path 520-a or 520-b). The second signal pad may be associated with the second memory die and may be coupled with logic circuit 502 via a second control signal conductive path 520 (e.g., control signal conductive path 520-a or 520-b). Logic circuit 502 may receive a testing configuration (e.g., including control information), or portions thereof, via either or both of the first signal pad and the second signal pad.

The control information (e.g., testing configuration) received by logic circuit 502 may include drive control inputs. For example, logic circuit 502 may receive drive control inputs via control signal conductive paths 520-a and 520-b and may generate a control signal to transmit via control conductive path 505-c or 505-d, or both (e.g., using logic sub-circuitry 515-b). The control conductive path 505 used for control signaling may be based on drive control inputs received via control signal conductive paths 520-a and 520-b. For example, logic circuit 502 may receive a drive control input via control signal conductive path 520-a associated with forwarding the test signal to the left (e.g., DriveLeft). Additionally or alternatively, logic circuit 502 may receive a drive control input via control signal conductive path 520-b associated with forwarding the test signal to the right (e.g., DriveRight). In some examples, drive control inputs may be represented by one or more logic values, such as a "0" or "1". In some cases, a logic value of "0" may indication an "off" state for a particular signaling direction, whereas a logic value of "1" may indicate an "on" state for the signaling direction.

For example, a DriveLeft input logic value of "1" and a DriveRight input logic value of "0" may indicate for logic circuit 502 to transmit a control signal configuring the logic circuit 501 to forward the test signal to the left (e.g., transmit a signal via control conductive path 505-a). Similarly, a DriveLeft input logic value of "0" and a DriveRight input logic value of "1" may indicate for logic circuit 502 to transmit a control signal configuring the logic circuit 501 to transmit the test signal to the right (e.g., transmit a signal via control conductive path 505-b). In some cases, if DriveRight and DriveLeft inputs both indicate a logic value "0" or "1," logic circuit 502 may suppress transmission of a control signal to logic circuit 501 and the test signal may be isolated. In some cases, if DriveRight and DriveLeft inputs both indicate a logic value "0" or "1" logic circuit 502 may transmit of a control signal to logic circuit 501 to configure logic circuit 501 to suppress transmission of the test signal (e.g., transmit a signal via control conductive paths 505-a and 505-b), such that the test signal may be isolated.

In some cases, logic circuit 502 may receive control information (e.g., via a testing configuration) from a neighboring memory die and one or more DQ pads associated with the neighboring memory die. For example, the first or second signal pad may transmit control information (e.g., as a portion of a testing configuration) forwarded from one or more DQ pads. The control information from a DQ pad may, for example, indicate a final memory die to receive a test signal (e.g., the test signal is to be isolated after propagation to the final memory die, or the memory die associated with the DQ pad), among other examples. Logic circuit 502 may receive such control information via control signal conductive path 520-a or 520-b, which may indicate logic values associated with DriveLeft or DriveRight, respectively.

In some examples, drive control inputs may be fixed by hardwiring the logic circuit 502 during manufacturing. For example, logic circuit 502 may be hardwired to route the test signal to the right of the first memory die, route the test signal to the left of the first memory die, or suppress transmission of the test signal, and may generate a corresponding control signal for logic circuit 501.

Figure 6:
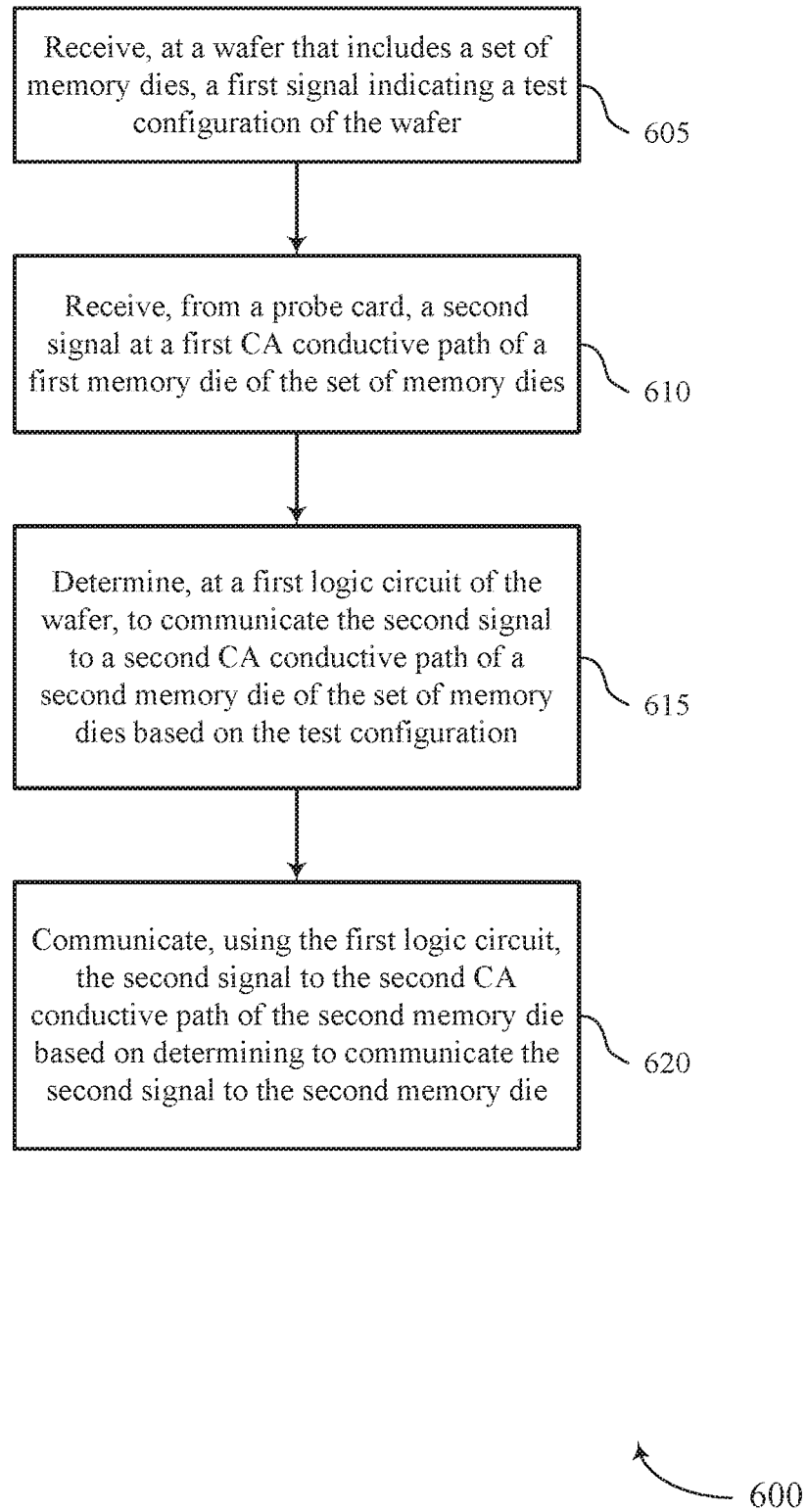
FIG. 6 shows a flowchart illustrating a method or methods that support interconnected CA resources in accordance with examples as disclosed herein.

FIG. 6 shows a flowchart illustrating a method or methods 600 that supports interconnected CA resources in accordance with examples as disclosed herein. The operations of method 600 may be implemented by a wafer that includes one or more memory devices or its components as described herein. In some examples, a memory device may execute a set of instructions to control the functional elements of the memory device to perform the described functions. Additionally or alternatively, a memory device may perform aspects of the described functions using special-purpose hardware.

At 605, the wafer may receive, at a wafer that includes a set of memory dies, a first signal indicating a test configuration of the wafer. The operations of 605 may be performed according to the methods described herein.

At 610, the wafer may receive, from a probe card, a second signal at a first CA conductive path of a first memory die of the set of memory dies. The operations of 610 may be performed according to the methods described herein.

At 615, the wafer may determine, at a first logic circuit of the wafer, to communicate the second signal to a second CA conductive path of a second memory die of the set of memory dies based on the test configuration. The operations of 615 may be performed according to the methods described herein.

At 620, the wafer may communicate, using the first logic circuit, the second signal to the second CA conductive path of the second memory die based on determining to communicate the second signal to the second memory die. The operations of 620 may be performed according to the methods described herein.

In some examples, an apparatus as described herein may perform a method or methods, such as the method 600. The apparatus may include features, means, or instructions (e.g., a non-transitory computer-readable medium storing instructions executable by a processor) for receiving, at a wafer that includes a set of memory dies, a first signal indicating a test configuration of the wafer, receiving, from a probe card, a second signal at a first CA conductive path of a first memory die of the set of memory dies, determining, at a first logic circuit of the wafer, to communicate the second signal to a second CA conductive path of a second memory die of the set of memory dies based on the test configuration, and communicating, using the first logic circuit, the second signal to the second CA conductive path of the second memory die based on determining to communicate the second signal to the second memory die.

Some examples of the method 600 and the apparatus described herein may further include operations, features, means, or instructions for determining, at a second logic circuit of the wafer, to communicate the second signal to a third CA conductive path of a third memory die of the set of memory dies based on the test configuration, and communicating, using the second logic circuit, the second signal to the third CA conductive path of the third memory die based on determining to communicate the second signal to the third memory die.

In some examples of the method 600 and the apparatus described herein, communicating the second signal to the second CA conductive path may include operations, features, means, or instructions for communicating the second signal via a first subset of the first logic circuit, the first subset of the first logic circuit coupled with the first CA conductive path and the second CA conductive path.

Some examples of the method 600 and the apparatus described herein may further include operations, features, means, or instructions for generating, at a second subset of the first logic circuit and based on determining to communicate the second signal to the second CA conductive path, a control signal for the first subset of the first logic circuit to transmit the second signal to the second CA conductive path, and communicating the control signal with the first subset of the first logic circuit, where communicating the second signal via the first subset of the first logic circuit may be based on communicating the control signal with the first subset of the first logic circuit.

Some examples of the method 600 and the apparatus described herein may further include operations, features, means, or instructions for determining, at a second logic circuit of the wafer, to suppress communication of the second signal to a third CA conductive path of a third memory die of the set of memory dies based on the test configuration, and suppressing communication of the second signal from the second CA conductive path to the third CA conductive path using the second logic circuit and based on determining to suppress communication of the second signal to the third memory die.

In some examples of the method 600 and the apparatus described herein, determining to suppress communication of the second signal to the third CA conductive path may include operations, features, means, or instructions for determining, at a second subset of the second logic circuit, that the third CA conductive path may be isolated from the second CA conductive path based on the test configuration, where suppressing communication of the second signal from the second CA conductive path to the third CA conductive path may be based on determining that the third CA conductive path may be isolated from the second CA conductive path. In some examples of the method 600 and the apparatus described herein, the second memory die may be free of physical contact from the probe card.

Some examples of the method 600 and the apparatus described herein may further include operations, features, means, or instructions for generating, at the second subset of the first logic circuit and based on determining to communicate the second signal to the second CA conductive path, a control signal for the first subset of the first logic circuit to suppress communication of the second signal from the second CA conductive path to the first CA conductive path and communicating the control signal with the first subset of the first logic circuit, where communicating the second signal via the first subset of the first logic circuit is based on communicating the control signal with the first subset of the first logic circuit.

Some examples of the method 600 and the apparatus described herein may further include operations, features, means, or instructions for communicating the second signal to a third memory die separated from the first memory die and the second memory die by one or more other memory dies, wherein the second signal is communicated via a plurality of logic circuits that comprises the first logic circuit and via multiple CA conductive paths that include the first CA conductive path and the second CA conductive path.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a first memory die including a first CA pad for receiving a signal from a probe card and a first CA conductive path coupled with the first CA pad, a second memory die including a second CA conductive path, and a logic circuit in a region positioned between the first memory die and the second memory die, where the logic circuit may be configured to selectively couple the first CA conductive path of the first memory die with the second CA conductive path of the second memory die.

In some examples, the logic circuit may include a first circuit coupled with and configured to selectively communicate the signal between the first CA conductive path and the second CA conductive path. In some examples, the logic circuit further may include a second circuit coupled with the first circuit, the first CA conductive path, and the second CA conductive path, the second circuit configured to control the first circuit to selectively communicate the signal. In some examples, the first memory die further may include a first signal pad for receiving a second signal from the probe card, the first signal pad coupled with the second circuit, and the second memory die further may include a second signal pad for receiving a third signal from the probe card, the second signal pad coupled with the second circuit.

Some examples of the apparatus may include a layer of material for routing signals to a set of memory dies that includes the first memory die and the second memory die, where the layer of material may be coupled with the set of memory dies. Some examples of the apparatus may include a set of CA pads located in the layer of material, the set of CA pads including the first CA pad, and a set of CA conductive paths located in the layer of material, the set of CA conductive paths including the first CA conductive path and the second CA conductive path.

Some examples of the apparatus may include a third memory die including a third CA conductive path, and a second logic circuit in a second region positioned between the second memory die and the third memory die, where the second logic circuit may be configured to selectively couple the second CA conductive path of the second memory die with the third CA conductive path of the third memory die. In some examples, the apparatus may include a third circuit coupled with and configured to selectively communicate the signal between the second CA conductive path and the third CA conductive path. In some examples, the first CA conductive path, the logic circuit, the second CA conductive path, and the second logic circuit may be configured to selectively communicate the signal between the first CA conductive path and the third CA conductive path.

An apparatus is described. The apparatus may include a memory die, a layer of material for routing signals to the memory die, where the layer of material may be coupled with the memory die. The layer of material may include a first CA conductive path associated with the memory die and having a first end that is coupled with the first CA pad and a second end that terminates at an edge of the layer of material and a second CA conductive path associated with the memory die and having a third end that is coupled with the first CA pad and a fourth end that terminates at the edge of the layer of material.

Some examples of the apparatus may include a gap in the layer of material that begins at the edge of the layer of material and terminates at a second edge of the layer of material. Some examples of the apparatus may include a second memory die coupled with the layer of material, where the layer of material further may further include a third CA conductive path associated with the second memory die and having an end that terminates at the second edge of the layer of material and a fourth CA conductive path associated with the second memory die and having an end that terminates at the second edge of the layer of material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a first memory die comprising:
a first command/address pad for receiving a signal from a probe card; and
a first command/address conductive path coupled with the first command/address pad;
a second memory die comprising a second command/address conductive path; and
a logic circuit in a region positioned between the first memory die and the second memory die, the logic circuit configured to selectively couple the first command/address conductive path of the first memory die with the second command/address conductive path of the second memory die and selectively isolate the first command/address conductive path of the first memory die from the second command/address conductive path of the second memory die.

2. The apparatus of claim 1, wherein the logic circuit comprises a first circuit coupled with and configured to selectively communicate the signal between the first command/address conductive path and the second command/address conductive path.

3. The apparatus of claim 2, wherein the logic circuit further comprises a second circuit coupled with the first circuit, the first command/address conductive path, and the second command/address conductive path, the second circuit configured to control the first circuit to selectively communicate the signal.

4. The apparatus of claim 3, wherein:
the first memory die further comprises a first signal pad for receiving a second signal from the probe card, the first signal pad coupled with the second circuit; and
the second memory die further comprises a second signal pad for receiving a third signal from the probe card, the second signal pad coupled with the second circuit.

5. The apparatus of claim 1, further comprising:
a layer of material for routing signals to a plurality of memory dies that comprises the first memory die and the second memory die, the layer of material coupled with the plurality of memory dies;
a plurality of command/address pads located in the layer of material, the plurality of command/address pads comprising the first command/address pad; and
a plurality of command/address conductive paths located in the layer of material, the plurality of command/address conductive paths comprising the first command/address conductive path and the second command/address conductive path.

6. An apparatus comprising:
a first memory die comprising:
a first command/address pad for receiving a signal from a probe card; and
a first command/address conductive path coupled with the first command/address pad;
a second memory die comprising a second command/address conductive path;
a logic circuit in a region positioned between the first memory die and the second memory die, the logic circuit configured to selectively couple the first command/address conductive path of the first memory die with the second command/address conductive path of the second memory die;
a third memory die comprising a third command/address conductive path; and
a second logic circuit in a second region positioned between the second memory die and the third memory die, the second logic circuit configured to selectively couple the second command/address conductive path of the second memory die with the third command/address conductive path of the third memory die.

7. The apparatus of claim 6, wherein the second logic circuit comprises a third circuit coupled with and configured to selectively communicate the signal between the second command/address conductive path and the third command/address conductive path.

8. The apparatus of claim 7, wherein the first command/address conductive path, the logic circuit, the second command/address conductive path, and the second logic circuit are configured to selectively communicate the signal between the first command/address conductive path and the third command/address conductive path.

9. A method, comprising:
receiving, at a wafer that comprises a plurality of memory dies, a first signal indicating a test configuration of the wafer;
receiving, from a probe card, a second signal at a first command/address conductive path of a first memory die of the plurality of memory dies;
determining, at a first logic circuit of the wafer, to communicate the second signal from the first command/address conductive path of the first memory die to a second command/address conductive path of a second memory die of the plurality of memory dies based at least in part on the test configuration; and
communicating, using the first logic circuit, the second signal from the first command/address conductive path of the first memory die to the second command/address conductive path of the second memory die based at least in part on determining to communicate the second signal to the second memory die.

10. The method of claim 9, further comprising:
determining, at a second logic circuit of the wafer, to communicate the second signal to a third command/address conductive path of a third memory die of the plurality of memory dies based at least in part on the test configuration; and
communicating, using the second logic circuit, the second signal to the third command/address conductive path of the third memory die based at least in part on determining to communicate the second signal to the third memory die.

11. The method of claim 9, wherein communicating the second signal to the second command/address conductive path comprises:
communicating the second signal via a first subset of the first logic circuit, the first subset of the first logic circuit coupled with the first command/address conductive path and the second command/address conductive path.

12. The method of claim 11, further comprising:
generating, at a second subset of the first logic circuit and based at least in part on determining to communicate the second signal to the second command/address conductive path, a control signal for the first subset of the first logic circuit to transmit the second signal to the second command/address conductive path; and
communicating the control signal with the first subset of the first logic circuit, wherein communicating the second signal via the first subset of the first logic circuit is based at least in part on communicating the control signal with the first subset of the first logic circuit.

13. The method of claim 11, further comprising:
generating, at a second subset of the first logic circuit and based at least in part on determining to communicate the second signal to the second command/address conductive path, a control signal for the first subset of the first logic circuit to transmit the second signal to the second command/address conductive path; and communicating the control signal with the first subset of the first logic circuit, wherein communicating the second signal via the first subset of the first logic circuit is based at least in part on communicating the control signal with the first subset of the first logic circuit.

14. The method of claim 9, further comprising:
determining, at a second logic circuit of the wafer, to suppress communication of the second signal to a third command/address conductive path of a third memory die of the plurality of memory dies based at least in part on the test configuration; and
suppressing communication of the second signal from the second command/address conductive path to the third command/address conductive path using the second logic circuit and based at least in part on determining to suppress communication of the second signal to the third memory die.

15. The method of claim 14, wherein determining to suppress communication of the second signal to the third command/address conductive path comprises:
determining, at a second subset of the second logic circuit, that the third command/address conductive path is isolated from the second command/address conductive path based at least in part on the test configuration, wherein suppressing communication of the second signal from the second command/address conductive path to the third command/address conductive path is based at least in part on determining that the third command/address conductive path is isolated from the second command/address conductive path.

16. The method of claim 9, further comprising:
communicating the second signal to a third memory die separated from the first memory die and the second memory die by one or more other memory dies, wherein the second signal is communicated via a plurality of logic circuits that comprises the first logic circuit and via a plurality of command/address conductive paths that comprises the first command/address conductive path and the second command/address conductive path.

17. The method of claim 9, wherein the second memory die is free of physical contact from the probe card.

18. An apparatus, comprising:
a memory die; and
a layer of material for routing signals to the memory die, the layer of material comprising a plurality of edges that are each substantially aligned in a vertical direction with a respective edge of the memory die, wherein the layer of material is coupled with the memory die and comprises:
a first command/address pad associated with the memory die;
a first command/address conductive path associated with the memory die and having a first end that is coupled with the first command/address pad and a second end that terminates at a first edge of the layer of material, wherein the first edge of the layer of material substantially aligns in the vertical direction with a first edge of the memory die; and
a second command/address conductive path associated with the memory die and having a third end that is coupled with the first command/address pad and a fourth end that terminates at a second edge of the layer of material, wherein the second edge of the layer of material substantially aligns in the vertical direction with a second edge of the memory die.

19. The apparatus of claim 18, further comprising:
a second memory die;
a second layer of material for routing signals to the second memory die and coupled with the second memory die, the second layer of material comprising a second plurality of edges that are each substantially aligned in the vertical direction with a respective edge of the second memory die; and
a gap that begins at the first edge of the layer of material and terminates at a first edge of the second layer of material.

20. The apparatus of claim 19, wherein the second layer of material further comprises:
a third command/address conductive path associated with the second memory die and having an end that terminates at the first edge of the second layer of material; and
a fourth command/address conductive path associated with the second memory die and having an end that terminates at a second edge of the second layer of material.

* * * * *